US006899997B2

(12) United States Patent
Yip et al.

(10) Patent No.: US 6,899,997 B2
(45) Date of Patent: May 31, 2005

(54) PROCESS FOR MODIFYING RESIST STRUCTURES AND RESIST FILMS FROM THE AQUEOUS PHASE

(75) Inventors: Siew Siew Yip, Erlangen (DE); Jörg Rottstegge, Lilienthal (DE); Ernst-Christian Richter, Erlangen-Bruck (DE); Gertrud Falk, Erlangen (DE); Michael Sebald, Weisendorf (DE); Kerstin Seibold, Nürnberg (DE); Marion Kern, Heroldsberg (DE)

(73) Assignee: Infineon Technologies AG, Munich (DE)

( * ) Notice: Subject to any disclaimer, the term of this patent is extended or adjusted under 35 U.S.C. 154(b) by 30 days.

(21) Appl. No.: 10/376,883

(22) Filed: Feb. 28, 2003

(65) Prior Publication Data

US 2003/0211422 A1 Nov. 13, 2003

(30) Foreign Application Priority Data

Feb. 28, 2002 (DE) ......................................... 102 08 786

(51) Int. Cl.[7] ............................. G03F 7/20; G03F 7/16; G03F 7/30; G03F 7/40; G03F 7/039
(52) U.S. Cl. ....................... 430/296; 430/311; 430/315; 430/325; 430/326; 430/330; 430/270.1; 430/331
(58) Field of Search ................................. 430/296, 311, 430/313, 315, 330, 331, 323–326, 328, 270.1

(56) References Cited

U.S. PATENT DOCUMENTS

| | | | | |
|---|---|---|---|---|
| 4,491,628 A | * | 1/1985 | Ito et al. | 430/176 |
| 5,173,393 A | * | 12/1992 | Sezi et al. | 430/323 |
| 5,234,793 A | * | 8/1993 | Sebald et al. | 430/323 |
| 5,234,794 A | | 8/1993 | Sebald et al. | |
| 6,110,637 A | | 8/2000 | Sezi et al. | 430/270.1 |

FOREIGN PATENT DOCUMENTS

EP   1 045 291 A2   10/2000

OTHER PUBLICATIONS

Grant & Hackh, Chemical Dictionary, 1987, McBraw–Hill, Inc., 5th Edition, pp. 22 and 564.*

* cited by examiner

*Primary Examiner*—Mark F. Huff
*Assistant Examiner*—John Ruggles
(74) *Attorney, Agent, or Firm*—Laurence A. Greenberg; Werner H. Stemer; Ralph E. Locher (57) ABSTRACT

A process for chemically amplifying structured resists includes applying a chemically amplified resist to a substrate and structuring it in a customary manner. Preferably, the amplification agent is applied in an aqueous phase to the structured resist and, after chemical amplification is complete, excess agent is removed by an aqueous wash medium. By using water as a solvent for the amplification agent and as a wash medium, it is possible to avoid organic solvents that constitute an explosion hazard. Furthermore, removal of partially exposed resist sections is suppressed.

19 Claims, 2 Drawing Sheets

PROCESS FOR MODIFYING RESIST STRUCTURES AND RESIST FILMS FROM THE AQUEOUS PHASE

BACKGROUND OF THE INVENTION

Field of the Invention

The invention relates to a process for amplifying structured resists.

In the production of microchips, thin films of photoresists are used for structuring semiconductor substrates. The photoresists can be selectively modified in their chemical nature by exposure with the aid of a mask or by direct irradiation, for example, with an electron beam. After a development step in which either the exposed or unexposed parts of the photoresist are removed, a structured photoresist is obtained and serves as a mask, for example, for etching the semiconductor substrate. In general, a plasma is used for etching where material is removed by particles that have a high energy. To be able to selectively etch only the bare parts of the substrate, the photoresist must have sufficient resistance to the etching plasma.

The action of an etching plasma can be divided approximately into a physical component and a chemical component. The physical component results in virtually material-independent removal. The constituents of the plasma strike the substrate surface and knock out particles there. To achieve a differentiation between sections covered by the resist mask and uncovered sections, the resist mask must have a certain film thickness so that a sufficient film thickness of the resist is still present on the covered sections at the end of the etching process in order to protect those sections of the substrate surface that are located underneath.

The chemical component of the etching process is based on a different reactivity of the plasma to various materials. Thus, organic materials are converted into gaseous compounds in an oxygen plasma so that rapid removal of material occurs, whereas organosilicon compounds are converted into silicon dioxide, which remains as a solid on the substrate surface and is removed only by the physical component of the etching action.

There are, therefore, two possibilities for increasing the etch resistance of the resist film. The first possibility of improving the etch resistance includes increasing the film thickness of the photoresist. However, an increase in the film thickness is subject to limits because the transparency of the resist decreases with increasing film thickness, with the result that the deeper parts close to the substrate are insufficiently exposed under certain circumstances. Consequently, only incomplete chemical modification of the photoresist takes place in the deeper parts of the photoresist and, after the development of the exposed photoresist, resist residues, i.e., resist feet, remain in the trenches. Error-free transfer of the structure predetermined by the photomask into a substrate is no longer possible. Furthermore, the imaged structure must also be focused in the photoresist film. Due to the short wavelengths that are used for imaging the structure, the image has only a small depth of focus. To achieve high resolution, the thickness of the resist film is, therefore, chosen to be as small as possible.

A second possibility for improving the etch resistance of a photoresist is based on an increase in the chemical etch resistance. For such a purpose, for example, silicon-containing groups are incorporated into the polymer of the photoresist. In the oxygen plasma, the silicon is, then, converted into a silicon dioxide film that covers the substrate. The silicon-containing groups can be introduced into the polymer by copolymerization of appropriate silicon-containing comonomers. A suitable comonomer is, for example, allyltrimethylsilane. Here, the silicon-containing groups are bound as side groups to the main chain of the polymer. If radiation of a very short wavelength is used for the exposure, for example, a wavelength of less than 200 nm, the carbon-silicon bond or carbon-carbon bond can be broken by the energy of the radiation. Low molecular weight silicon-containing compounds are formed and escape from the resist and are converted into silicon dioxide by residual oxygen or moisture that is present in the gas phase above the photoresist. Silicon dioxide is deposited on the optical systems of the exposure unit and damages these irreversibly. In polymers for photoresists that are suitable for short wavelengths, in general, no silicon-containing groups are, therefore, provided.

To, nevertheless, achieve sufficient etch resistance of the resist in the etching plasma, a chemical amplification process has been developed for the photoresists used to date for wavelengths of, for example, 248 nm or 193 nm, by which process the dimensions of structures in photoresists and their etch resistance can be, subsequently, modified.

Therein, the photoresist is chemically amplified with an amplification agent after the structuring, i.e., after the exposure and development of the photoresist. For such a purpose, the polymer contained in the photoresist includes anchor groups that can react with a suitable reactive group of an amplification reagent in order to bind the amplification agent to the polymer. By incorporating further groups or molecules, it is possible to increase the film thickness of the photoresist subsequently. If the resist structures have a sufficient film thickness, it is also possible to achieve a narrowing of the trenches by lateral growth of films on the sidewalls of the trenches of the structured resist. This permits an improvement in the resolution, for example, a representation of narrower conductor tracks. Simultaneously with the lateral growth, the film thickness, too, increases perpendicular to the substrate surface.

For the chemical amplification of the photoresist, the anchor groups must have sufficient reactivity to react with the reactive group of the amplification agent within a short reaction time and to bind the agent to the polymer through a, preferably, covalent bond.

Such subsequent chemical amplification of photoresists is possible, for example, by the Chemical Amplification of Resist Lines (CARL) process described in European Patent Application 0 395 917 B1, corresponding to U.S. Pat. No. 5,234,794 to Sebald et al. and U.S. Pat. No. 5,234,793 to Sebald et al. For such a purpose, for example, maleic anhydride is incorporated as a comonomer into the polymer of the photoresist. The carboxylic anhydride group, then, serves as an anchor group that can be nucleophilically attacked, for example, by an amino group of the amplification agent. The amplification agent is applied in the form of a solution in a suitable solvent to the structured resist and is, then, bound to the polymer of the photoresist through an amide bond.

As such, organosilicon groups can also be incorporated subsequently into the resist structure in order, subsequently, to increase the etch resistance in the oxygen plasma. This incorporation reaction is often referred to as silylation. Apart from silicon-containing groups, aromatic or polycyclic non-aromatic groups can also be introduced into the polymer to increase the etch resistance or the film thickness. The introduction of aromatic groups is generally referred to as aromatization.

In the CARL process, the amplification agent is applied in the form of a solution in an organic solvent to the resist. Furthermore, after chemical amplification, washing is finally effected with a further organic solvent to remove excess amplification agent. Generally used solvents are lower alcohols, such as hexanol, methanol, ethanol, or, in particular, isopropanol. Also suitable are ketones, such as acetone, esters, such as ethyl acetate, or ethers, such as tetrahydrofuran. These solvents are flammable and many of them can form explosive mixtures with air. In the processing of the resist, appropriate safety measures must, therefore, be taken to exclude any danger. The apparatuses used for the process are, therefore, more expensive. Furthermore, the organic solvents must be disposed of, for example, by incineration, after the chemical amplification has been carried out. For such a purpose, the solvent residues must be transported to the incineration plants, comprehensive safety and administrative regulations having to be observed in this respect too. Moreover, difficulties in the amplification of partially exposed parts occur in the CARL process used to date. Partially exposed parts are those sections of the photoresist film that have undergone exposure but where the exposure dose was too small to effect a sufficient modification of the photoresist so that the photoresist is not removed from the substrate during the development. Although the partially exposed parts are not removed during the development, they have, in fact, undergone a chemical modification by the exposure and the subsequent heating so that their chemical and physical properties differ from the unexposed parts. During the chemical amplification, the resist film is initially swollen or even partially dissolved at the edges of the structures by the solvent of the amplification agent. This makes it possible for the amplification agent also to penetrate in deeper layers of the photoresist and to react there with the anchor groups of the polymer. As a result of the reaction between amplification agent and anchor groups, the polymer becomes increasingly non-polar, or crosslinking of the polymer by the amplification agent occurs. Consequently, the solubility of the polymer in the solvent of the amplification agent also decreases. If the swelling or the dissolution of the resist films predominates at the beginning of the chemical amplification, the surface of the resist film is increasingly crosslinked by the reaction of the amplification agent with the polymer and the dissolution of the resist film is suppressed. By the further incorporation of amplification agent, the film thickness increase finally predominates over further dissolution of the resist film. There is, now, an increase in the volume of the resist structure. The loss of film thickness may be more than about 20 nm in the first 25 s of the chemical amplification. Only after this period, i.e., after sufficient crosslinking of the resist film by the amplification agent, does the film thickness increase predominate over the removal of the film by the solvent.

The chemical amplification processes known to date are optimized for high reaction rates and anhydride-containing polymers having a high content of free carboxylic acids. It has been observed that, in particular, partially exposed parts dissolve during the chemical amplification and a final wash step in which excess amplification agent is removed. Partially exposed parts are formed, for example, at the boundary between exposed and unexposed parts. The chains of the polymer can be disposed in the photoresist so that they stretch across the boundary between exposed and unexposed parts. During the exposure, chemical modification, therefore, takes place only in a segment of the polymer. If the fraction of the chemically modified segment falls below a certain value, the polymer is no longer removed during the development but remains on the sidewalls of the resist structure. The sidewalls of a resist structure, therefore, generally have a different chemical structure to the top of an area that was not exposed. Partially exposed parts, furthermore, are formed as a result of interference effects between adjacent orifices in the photomask. This results in scattered light by which the photoresist is exposed but the exposure intensity is not sufficient to effect complete cleavage of the acid-labile groups of the polymer. In the cleavage of the acid-labile groups, only some of these groups are, therefore, cleaved and the polarity of the polymer is, therefore, not increased to such an extent that it is removed from the substrate surface during the development with an alkaline developer. The polarity of the solvent for the chemical amplification, which differs from the polarity of the alkaline developer, can now be chosen so that removal of the partially exposed parts takes place and, hence, destruction of the imaged structure. In the partially exposed parts, the reaction rate of the chemical amplification is higher due to the additional carboxyl groups but, at the same time, the solubility of the polymer also changes considerably due to the increased polarity.

The difficulties described above in carrying out the CARL process occur, in particular, when the process is applied to ultrathin resist films having a thickness of less than about 50 nm and to fine resist structures having widths of less than 100 nm. A film thickness increase or a broadening of the structure can no longer take place because sufficient material is, now, no longer available in the resist film/resist structure. In general, the inhibition in the case of ultrathin films and ultrathin structures is so low that the thin resist films completely dissolve. A subsequent increase in the thickness of ultrathin films, therefore, appears impossible.

The chemical amplification of structures that have a very high aspect ratio presents a further difficulty. An aspect ratio is defined as the ratio of the height of the structure, i.e., the thickness of the resist film, to the width of the structure. If the structure includes extensive resist areas, these often collapse during drying. During the chemical amplification, the solvent in which the amplification agent is dissolved penetrates into the resist structures and causes them to swell. At the end of the amplification reaction, the amplified structures are, therefore, very soft. After the chemical amplification or after the final wash step, trenches disposed between the resist lines are initially still filled with solvent. During the drying, the solvent evaporates, and capillary forces act on the resist structures. These lead to a deformation of the resist structures and, in extreme cases, cause the structure to be torn off from the base.

SUMMARY OF THE INVENTION

It is accordingly an object of the invention to provide a process for modifying resist structures and resist films from the aqueous phase that overcomes the hereinafore-mentioned disadvantages of the heretofore-known devices and methods of this general type and that provides a process for the chemical amplification of structured resists that can be easily integrated into the industrial production of microchips and that also permits the processing of thin resist films.

With the foregoing and other objects in view, there is provided, in accordance with the invention, a process for amplifying structured resists includes the following steps:
(a) application of a chemically amplified photoresist to a substrate, the photoresist having the following components:
a film-forming polymer that includes acid-labile groups that are cleaved under the action of acid and liberate groups that result in an increase in the solubility of the film-forming polymer in aqueous alkaline developers, and that furthermore includes anchor groups for the linkage of amplification agents, it also being possible for the anchor groups to be present in the form of a protected anchor group;

a photo acid generator;

a solvent in which the film-forming polymer is soluble;

(b) drying of the photoresist to give a resist film;

(c) section-by-section exposure of the photoresist film so that an exposed resist is obtained, an acid being liberated by the photo acid generator in the exposed parts;

(d) heating of the exposed resist, the acid-labile groups being cleaved in the exposed parts and polar groups being liberated on the film-forming polymer, with the result that a contrasted resist having polar resist sections and non-polar resist sections is obtained;

(e) development of the contrasted resist with an alkaline developer that has a higher polarity than the solvent of the photoresist and in which the film-forming polymer is insoluble, the polar resist sections being removed from the substrate and a structured resist being obtained;

(f) application of a solution of an amplification agent to the structured resist, the amplification agent having at least one reactive group that can react with the anchor group of the film-forming polymer, and the amplification agent being present in solution in a solvent in which the film-forming polymer is insoluble, and leaving of the solution of the amplification agent on the structured resist so that a linkage of the amplification agent to the film-forming polymer takes place and an amplified resist is obtained; and (g) washing of the amplified resist with a wash medium that contains water as a solvent so that excess amplification agent is removed.

In contrast to the CARL process used to date, in the process according to the invention, washing is effected not with an organic solvent, generally, an alcohol, but with water. Pure water is, preferably, used. However, the wash medium may also contain further substances, for example, surfactants, buffers or inert ions. Water is considerably more polar than the solvents used to date and, therefore, does not partially dissolve the partially exposed parts in which chemical amplification has taken place. During washing of the amplified resist, the loss of resist, which to date had to be accepted due to dissolution of the resist in the wash medium, is, therefore, suppressed. Furthermore, water can be disposed of or worked up without problems by, for example, distilling off the water and further working up the remaining residues or disposing of them in a landfill.

In carrying out the process according to the invention, the procedure adopted is, in principle, similar to that in the abovementioned CARL process. What is important, however, is the use of an aqueous wash solution so that the amplified resist film is no longer dissolved.

Polymers that may be used for the production of the photoresist employed in the process according to the invention are, in principle, all customary polymers that are used in photoresists and possess, in the polymer chain or as side groups, acid-labile groups that have low alkali solubility and produce polar groups, for example, acidic groups, on the polymer by the catalytic action of acid and, optionally, a simultaneous thermal treatment (contrasting). Examples of suitable acid-labile groups are: tert-alkyl ester, tert-butoxycarbonyloxy, tetrahydrofuranyl, tetrahydro-pyranyl, tert-butyl ether, lactone or acetal groups. Tert-Butyl ester groups are particularly preferred. Carboxyl groups or, preferably, acidic hydroxyl groups, by which the polarity of the polymer and, hence, its solubility in polar, preferably, alkaline developers increase, are liberated from these acid-labile groups under the catalytic action of acid. Such polymers are described, for example, in the abovementioned European Patent Application 0 395 917 B1.

The film-forming polymer can be obtained by polymerization or copolymerization of appropriate monomers that include acid-labile groups. Suitable monomers are, for example, acrylates, methacrylates, maleic monoesters and diesters, itaconic monoesters and diesters, norbornenecarboxylic esters or norbornene-dicarboxylic monoesters and diesters. The ester group forms the acid-labile group. For example, tert-butyl esters are suitable.

The polar groups formed from the acid-labile groups may, themselves, be used as anchor groups for binding the amplification agent. For such a purpose, after the development of the exposed resist, the acid-labile groups are cleaved and polar groups are liberated also in the previously unexposed parts of the structured resist. The reaction between polar group and amplification agent can lead to the formation of a covalent bond between anchor group and amplification agent. However, the amplification agent can also be linked to the anchor group of the polymer through noncovalent bonds, for example, ionic interactions or dipole-dipole interactions.

In addition to the acid-labile groups, further groups that act as reactive anchor groups in the chemical amplification are, preferably, present in the polymer of the photoresist. A reactive anchor group is understood as meaning an anchor group that can react with amplification agent even without further activation. For example, no prior elimination of protection of the anchor group is, therefore, required for the chemical amplification. Suitable reactive anchor groups are, for example, groups that are selected from the group consisting of anhydrides, isocyanates, imides, epoxides, esters, amides, carboxylic acids, ketenes, oxiranes, sulfonic acids, thiophenols and urethanes. These reactive anchor groups are introduced into the polymer of the photoresist by copolymerization of appropriate monomers that contain at least the reactive anchor group and a polymerizable carbon-carbon double bond.

Particularly suitable anhydride groups are carboxylic anhydrides, in particular, groups derived from maleic anhydride, because these systems have readily accessible electrophilic anchor groups that facilitate binding of the nucleophilic amplification agent.

In addition to the monomers, other monomers that are customary for the preparation of polymers for photoresists and, for example, improve the lithographic properties of the resist or its etch resistance can also be used. The polymers must have adequate film formation properties to be able to produce a uniform film of the photoresist on the substrate.

The photo acid generators employed may be the photo acid generators customary for photoresists. Onium compounds, as described, for example, in European Patent Application 0 955 562 A1 are, preferably, used.

For example, methoxypropyl acetate, cyclopentanone, cyclohexanone, γ-butyrolactone, ethyl lactate, diethylene glycol dimethyl ether or a mixture of at least two of these solvents may be used as a solvent of the resist. In general, however, it is possible to use all customary solvents or mixtures thereof that are capable of taking up the resist components to give a clear, homogeneous solution having a long shelf life and that ensure a good film quality on coating of the substrate.

The components described can be used in the photoresist in the following ratios:
- film-forming polymer: 1–50% by weight, preferably, 2–10% by weight;
- photo acid generator: 0.01–10% by weight, preferably, 0.1–1% by weight; and
- solvent: 50–99% by weight, preferably, 88–97% by weight.

Further components/additives that influence the resist system advantageously with respect to resolution, film formation properties, shelf life, radiation sensitivity, and pot life effect may also be added to the photoresist.

The photoresist is applied to the substrate by customary methods, for example, by spraying on, spin coating or a dip process. The solvent is, then, removed by customary methods. For such a purpose, the substrate with the resist film is, generally, heated. As a result of the heating, defects in the resist film, for example, cavities, which form during evaporation of the solvent, can also be healed.

Section-by-section exposure of the resist film is, then, effected, it also being possible to use customary methods for this purpose. During the exposure, for example, a photomask that reproduces the desired structure on the photoresist can be disposed in the beam path. However, direct exposure of the photoresist to focused electrons or ions, during which the structure is written on the photoresist by the focused beam, is also possible. Exposure is, preferably, effected using an exposure radiation having a wavelength in the range from 10 to 400 nm. The exposure radiation, particularly preferably, has a wavelength of less than 200 nm. In the exposed parts, an acid is liberated from the photo acid generator so that a latent image of the desired structure is formed. At this time, the film-forming polymer is still present in its protected form, i.e., the groups catalytically cleavable by acid have not yet been cleaved.

After the exposure of the resist film, a contrasting step is carried out in which the latent image is enhanced and is imprinted into the polymer of the photoresist so that the photoresist, now, has a chemical profile. For such a purpose, the substrate with the exposed resist film is heated, generally, to temperatures of 80 to 200° C. The acid-labile groups on the polymer are cleaved under the catalytic influence of the acid and polar groups are liberated. The contrasted resist film, now, includes non-polar sections in which the film-forming polymer is present in its original non-polar form and polar sections that contain the polar polymer.

The development step utilizes the different polarities of the polymer in the exposed and unexposed sections, i.e., its different solubility in the aqueous alkaline developer. If the polymer in the unexposed state includes acid-labile ester groups, it includes carboxyl groups after exposure and contrasting. The polymer in the unexposed state is, therefore, comparatively non-polar and is soluble in non-polar or weakly polar solvents. In contrast, the polymer after exposure and contrasting has a polar character and is, therefore, insoluble in non-polar or weakly polar solvents. This difference in the solubility is, now, utilized in the development step. The aqueous alkaline solvent is, therefore, chosen so that the polar polymer is readily soluble therein while the non-polar film-forming polymer is insoluble therein. Consequently, in the development step, only the exposed parts of the substrate are removed, and structures in which the substrate is in bare form in the exposed parts.

According to the invention, the development of the contrasted photoresist is followed by a chemical amplification of the structured resist. For such a purpose, the amplification agent is applied in the form of a solution in a suitable solvent to the structured resist. The amplification agent includes a reactive group that is selected so as to be suitable for the anchor group of the polymer so that anchor group and reactive group of the amplification agent are capable of reacting. The coordination of the amplification agent to the polymer is, preferably, effected by formation of a chemical bond between the anchor groups of the polymer and the reactive group of the amplification agent, for example, with formation of an amide bond. A salt bond or a coordination of polar groups by dipole interactions is also possible. The amide bond can also be formed by first forming an ammonium salt in the development/amplification step by the anchor group and the amplification agent and carrying out heating in a subsequent production step, for example, during the drying of the developed and amplified resist, a bond being formed between polymer and amplification agent with elimination of water.

The film thickness increase can be controlled by the duration of the reaction and the concentration of the amplification agent. In a further embodiment of the process according to the invention, the film thickness increase of the resist structure, which is effected by incorporation of the amplification agent, is regulated by the temperature.

The treatment of the resist structure with the amplification agent is, preferably, carried out at room temperature and at atmospheric pressure.

Finally, excess amplification agent is removed, water or an aqueous solution being used according to the invention for such a purpose. In accordance with another mode of the invention, the wash medium, preferably, contains water in an amount of more than 95% by weight, pure water, particularly preferably, being used as the wash medium.

In accordance with a further mode of the invention, the liquid phase of the amplification agent is also an aqueous solution or an aqueous emulsion. In such an embodiment of the process according to the invention, water or an aqueous solvent mixture is also used for the chemical amplification. The effort required for avoiding the formation of ignitable air/solvent mixtures can be further reduced. The effort required for eliminating solvent wastes is also considerably reduced. Compared with the CARL process used to date, the amplification of the structured resist is considerably simplified by changing over to aqueous systems, which is important particularly for carrying out the process on an industrial scale. No special apparatuses are required for carrying out the process but it is possible, in principle, to use the same apparatuses as also employed for the development of the contrasted resist with an aqueous developer. A further advantage is that the solubility of the film-forming polymer, in particular, in the partially exposed parts of the resist film, in an aqueous solution for the chemical amplification is considerably lower compared with the alcoholic solvent system used to date. Consequently, the partially exposed parts of the structured resist are partially dissolved by the solvent of the chemical amplification agent to a considerably lesser extent, i.e., are preserved to a much greater extent so that even thin resist films or fine resist structures are accessible to a chemical amplification.

In the process according to the invention, the chemical amplification is carried out, in principle, in the same manner as in the CARL process used to date, i.e., the aqueous solution or the aqueous emulsion of the amplification agent is added to the structured resist, for example, by a puddle method or by a dip method. The liquid phase of the amplification agent is, then, left for a certain period on the structured resist, during which the reactive group of the amplification agent can react with the anchor group of the polymer, for example, a carboxylic acid group, a hydroxyl group or a carboxylic anhydride group. As a result of incorporating the amplification agent into the polymer of the photoresist, there is an increase in the volume of the structures of the structured resist, i.e., the film thickness and the width of the resist structures increase. After the end of the reaction time, which, for example, can be determined empirically, the liquid phase is removed, for example, by centrifuging, and, according to the invention, the amplified resist structure is washed with an aqueous wash medium.

In accordance with an added mode of the invention, the liquid phase of the amplification agent, preferably, contains water in an amount of from 50% by weight to 99% by weight, particularly preferably, from 90 to 97% by weight.

If the chemical amplification of the contrasted resist is carried out in the aqueous phase, development and chemical amplification of the contrasted resist can also be carried out in a common step. In such a case, the developer solution also contains the amplification agent in addition to water and a basic additive, for example, tetramethylammonium hydroxide. Alternatively, this step can also be effected with the solution for the amplification, consisting of water, the amplification agent and, if required, further additives. Because the polymer of the resist has a very high polarity in the exposed parts, due to the cleavage of the acid-labile groups, the dissolution of the polar resist in the developer medium predominates over the amplification reaction in these parts. At the beginning of the development step, the exposed sections of the contrasted photoresist are, therefore, initially dissolved before the amplification reaction then predominates and a chemical amplification of the unexposed parts of the contrasted resist takes place. Because development and chemical amplification are carried out simultaneously, the production of the chemically amplified structured resist can be accelerated. Furthermore, less apparatus is required because the chemical amplification is carried out in the apparatuses for the development of the contrasted resist. The process according to the invention can, therefore, be very easily integrated into existing production lines because only the amplification agent has to be added to the developer solution and no additional apparatuses are required for carrying out the chemical amplification. Alternatively, the amplification solution is used directly as a modified developer solution.

For a rapid reaction of the amplification agent with the anchor groups of the polymer, it is advantageous if the structured photoresist is swollen in order to enable the amplification agent to gain access to the deeper layers of the resist. A swelling promoter is, therefore, advantageously added to the solution of the amplification agent.

In accordance with an additional mode of the invention, the swelling promoter is an alcohol, a carboxylic acid, or a surfactant.

Suitable swelling promoters are, for example, solvents that are soluble in water and have a lower polarity than water. For example, ethers or esters that can partially dissolve the polymer are suitable, but the amount of these solvents is chosen to be so low that removal of the photoresist by the water is effectively suppressed. Solvents that, themselves, have a reactive group that can nucleophilically attack the anchor group of the polymer, such as, for example, alcohols, are also suitable. Examples of suitable alcohols are hexanol, isopropanol, ethanol, ethylene glycol, propylene glycol or butanediol. These reactive solvents are added in low concentrations so that, on one hand, swelling of the polymer is effected and, on the other hand, the polymer is not dissolved in the solvent of the amplification agent and, furthermore, a reaction of the amplification agent with the polymer is not suppressed in favor of alcoholysis of the anchor groups.

Surfactants may also be added as swelling promoters to the solution or emulsion of the amplification agent. For example, polyethylene oxide alkyl ethers or sodium dodecylsulfate are suitable. By surfactants, the surface tension or interfacial tension is reduced, with the result that the amplification agent can penetrate more easily into the structured resist in order to react with the anchor groups of the polymer.

If the liquid phase for the chemical amplification is strongly alkaline, it is possible to add carboxylic acids, such as, for example, acetic acid or propionic acid, which neutralize the solution or emulsion for the chemical amplification. As such, even strongly exposed parts no longer dissolve in the aqueous phase of the chemical amplification agent.

In accordance with yet another mode of the invention, to accelerate the chemical amplification reaction, one or more sterically hindered bases or tertiary amines may also be added to the liquid phase of the chemical amplification agent. These compounds catalyze the opening of the carboxylic anhydride groups and, hence, their reaction with the amplification agent. Suitable bases are, for example, triethylamine, trimethylamine, diazabicycloundecene (DBU), diazabicyclononene (DBN) and diazabicyclooctane (DABCO).

The amplification agent must contain a reactive group that can react with the anchor group on the polymer. The reactive group of the amplification agent is, therefore, chosen according to the anchor group of the film-forming polymer. If the film-forming polymer contains acidic groups, such as, for example, hydroxyl groups or carboxylic acid groups, or nucleophilically attackable groups, such as, for example, carboxylic anhydride groups, as anchor groups, the reactive group of the amplification agent is, preferably, an amino group. The amino group can nucleophilically attack one of the carbon atoms of the carboxylic anhydride group and react to give the acid amide with ring opening. Here, a primary or secondary amino group is, preferably, provided on the amplification agent. However, the amino group can also form an ammonium salt with acidic groups of the polymer so that the amplification agent is bound through an ionic interaction.

In accordance with a concomitant mode of the invention, the amplification agent, particularly preferably, has at least two reactive groups that are capable of reacting with the anchor group of the film-forming polymer. As such, crosslinking of the polymer can take place during chemical amplification, with the result that the stability of the structures of the structured resist increases and the solubility of the amplified resist in the liquid phase of the chemical amplification agent or in the wash medium is further reduced.

In addition to the reactive group, the amplification agent, preferably, includes organosilicon, aromatic or cyclic non-aromatic cycloaliphatic, in particular, polycyclic non-aromatic radicals. Suitable monofunctional amplification agents are, for example, arylamines, such as benzylamine, alkylamines, such as cyclohexylamine, or organosilicon amines, such as aminopropylmethyldiethoxysilane.

Suitable bifunctional amplification agents are, for example, aryldiamines, such as alkyldiamines, such as bis(aminomethyl)adamantane, bis(aminoethyl)adamantane, bis(aminopropyl)adamantane, norbornyldiamine, bis(aminomethyl)norbornane, bis(aminomethyl)-bicyclo[2.2.2]octane, bis(aminomethyl)-tricyclo[5.2.1.0$^{2,6}$]decane or or silicon-containing diamines, such as in which n=0 to 15, preferably, n<5.

Trifunctional amplification agents, such as aryltriamines, are, furthermore, suitable, it also being possible for the triamines to include heterocyclic parent structures. Furthermore, alkyltriamines or silicon-containing triamines may be used. Exemplary aryltriamines and alkyltriamines are shown below:

Monofunctional aryl- and alkylamines and polyfunctional silicon-containing amines that contain more than three amino groups are furthermore suitable. Examples of such compounds are shown below:

where, m =0–15; k=0–15; and l=0–15.

The compounds shown are intended to serve merely by way of example and various modifications of the structure are possible. Thus, for example, in the allylamines shown, any desired positions of the amino group on the ring are possible. Moreover, the amino groups can be linked to the ring or the alkyl chain or the siloxane chain through any desired alkyl chains, which include, for example, from 1 to 10 carbon atoms, as spacers. Furthermore, in addition to the non-aromatic and aromatic rings shown, bi- or polycyclic ring systems may also be used. Examples of such partial structures are bisphenol or naphthalene structures. Furthermore, the compounds shown may also be substituted as desired by alkyl groups. To improve the solubility of the amplification agent in water, the amplification agent may additionally contain polar groups. Examples are alcohol groups, ether groups, ester groups, preferably, methoxy ester or ethoxy ester groups, and acid groups. Examples of such substances are 2-aminoethanol and aminopropylsilanetriol. Any desired combinations of these mono- to polyfunctional amines may also be used to be able to influence the chemical amplification in a desired manner. A combination of low molecular weight primary amines or even ammonia with bi- or polyfunctional amines having a higher molecular weight combines rapid diffusion of the low molecular weight components with crosslinking by the bi- or polyfunctional components.

In general, the components described can be used in the liquid phase for the chemical amplification in the following amounts:

amplification agent: 0.1–50% by weight, preferably, from 2 to 10% by weight;

additives: 0.1–30% by weight, preferably, 0.1–10% by weight; and water: 50–99% by weight, preferably, 90–97% by weight.

Other features that are considered as characteristic for the invention are set forth in the appended claims.

Although the invention is illustrated and described herein as embodied in a process for modifying resist structures and resist films from the aqueous phase, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
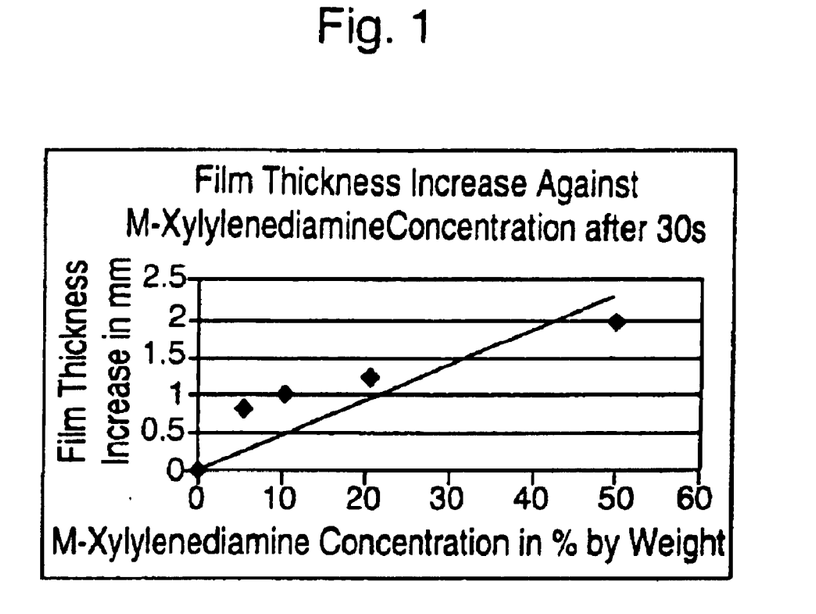
FIG. 1 is a graph illustrating a film thickness increase as a function of the m-xylylenediamine concentration.

EXAMPLE 1
Film Thickness Increase as a Function of the Concentration of the Amplification Agent A resist film was produced on a silicon wafer from a resist that contains a copolymer of maleic anhydride and norbornene derivatives and a photo acid generator. The resist film was exposed with a test pattern, heated, and developed with a standard alkaline developer according to customary methods. Aqueous solutions that contained m-xylylenediamine in varied concentrations (0% by weight, 5% by weight, 10% by weight, 20% by weight, and 50% by weight) were added to the structured resist. The solution of the amplification agent was left on the wafer for 30 s and, then, washed away with water. After drying, the film thickness increase was determined, the comparative samples in which the solution contained no amplification agent being used as a standard. The film thickness increases are shown graphically in FIG. 1. The rate increases of the chemical amplification or the film thickness increase with increasing concentration of the amplification agent m-xylylenediamine.

EXAMPLE 2
Addition of Swelling Promoters

Figure 2:
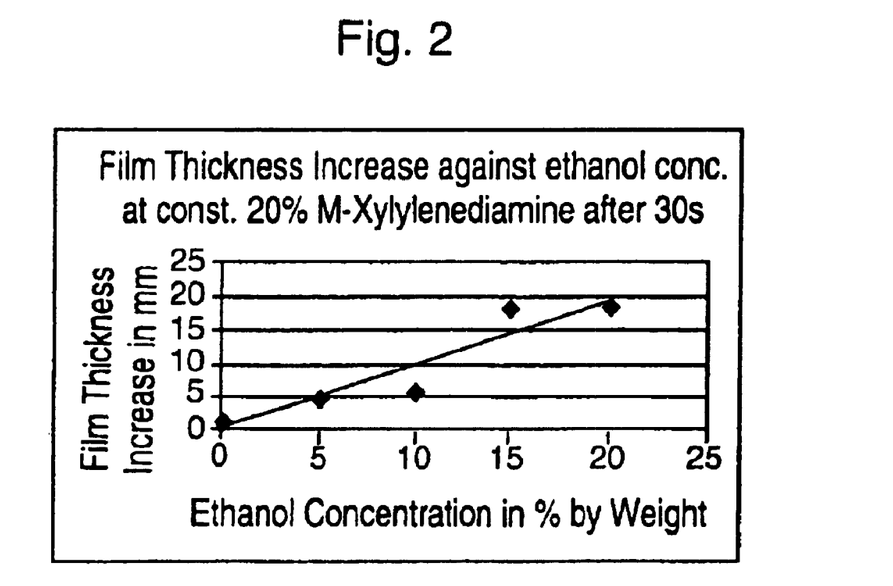
FIG. 2 is a graph illustrating a film thickness increase plotted as a function of the added amount of ethanol, the amount of the amplification agent having been kept constant.

A silicon wafer with a resist structure was produced as in Example 1. A solution of a chemical amplification agent that contained 20% by weight of m-xylylenediamine and ethanol in different concentrations in water was added to the structured resist. The solution of the amplification agent was left in each case for 30 s on the wafer and, then, washed away with water. The concentration of the ethanol was in each case 0% by weight, 5% by weight, 10% by weight, 15% by weight, and 20% by weight. After chemical amplification, the film thickness increase was determined, the sample in which no ethanol was present being taken as a standard (film thickness increase=1.2 nm). The measured film thickness increases are shown graphically in FIG. 2. An acceleration of the chemical amplification or a greater increase in the film thickness after 30 s can be achieved with increasing ethanol concentration.

EXAMPLE 3
Film Thickness Increase as a Function of Time

Figure 3:
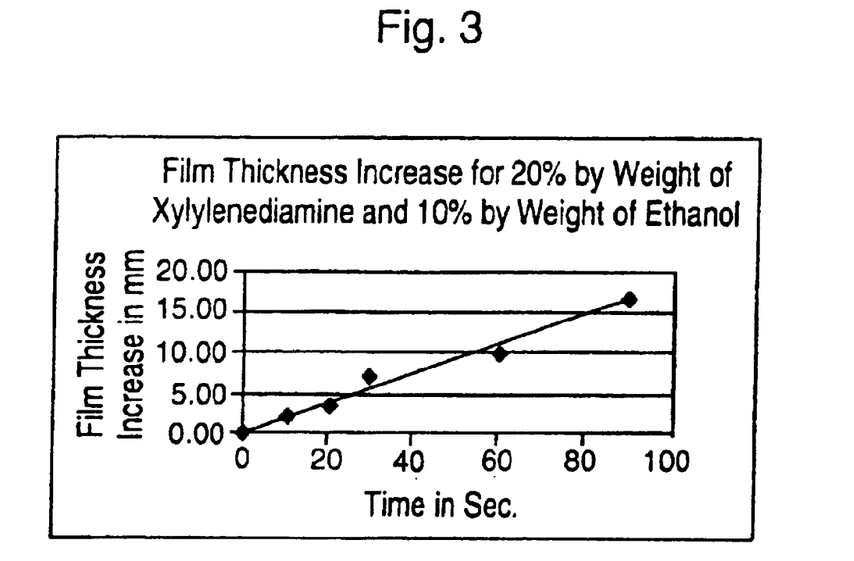
FIG. 3 is a graph illustrating a film thickness increase as a function of time.

A silicon wafer with a resist structure was produced as in Example 1. A solution of a chemical amplification agent that contained 20% by weight of m-xylylenediamine and 10% by weight of ethanol in water was added to the structured resist. The amplification solution was left on the resist in each case for 10 s, 20 s, 30 s, 60 s, and 90 s and, then, washed away with water. The film thickness increase was determined in each case in comparison with the film thickness of the structured resist. The measured values are shown in FIG. 3. Greater film thickness increases can be achieved with a longer reaction time. Even after 10 s, a substantial film thickness increase is observable, i.e., there is no removal or only very slight removal of the structured resist at the beginning of the chemical amplification reaction.

EXAMPLE 4
Film Thickness Increase as a Function of the Exposure Dose

A resist film was produced on a silicon wafer as in Example 1. The resist film was, then, exposed using a test pattern, i.e., a gray wedge, with the result that the resist film was exposed to different exposure doses. For comparison, a first resist film was developed directly with a standard developer and a second resist film was treated for 30 s only with a solution that contained 20% by weight of m-xylylenediamine and 10% by weight of ethanol in water. The film thickness increase or decrease was determined in each case relative to the original film thickness of the resist film.

If the exposed resist is treated only with a developer solution, the film thickness in the case of high exposure doses initially remains constant because only small amounts of acid are liberated and, as a result, only a small number of acid-labile groups of the polymer are cleaved. Above a threshold value, sufficient acid is produced to catalyze the liberation of polar groups on the polymer so that complete removal of the photoresist occurs.

If the exposed resist is treated with a solution for chemical amplification, the film thickness increase initially increases sharply with increasing exposure dose, i.e., increasing polarity of the copolymer. Only at high doses does the removal of the polymer predominate over the chemical amplification so that the solution of a chemical amplification agent acts only as a developer and the resist film is removed from the substrate.

EXAMPLE 5

Silicon wafers were coated with a resist film as in Example 1, two different resists (resist 1, resist 2) being used. A solution for chemical amplification that contained benzylamine in various concentrations (3% by weight and 5% by weight) in water was added to the unexposed resist films. The amplification agent was left for different times (0 to 120 s) on the resist and, then, washed away with water. Finally, the film thickness increase achieved was determined.

EXAMPLE 6

A silicon wafer was first provided with a resist film as in Example 1. The resist film was, then, exposed through a mask so that contact holes were defined. The exposed resist was heated and developed in a customary manner so that a resist structure was obtained. A solution of a chemical amplification agent that contained 2% by weight of benzylamine in water was added to this structured resist. The amplification agent was left for 60 seconds on the resist and, then, washed away with water. The diameter of the contact holes has decreased from about 230 nm to about 180 nm.

We claim:

1. A method for amplifying structured resists, which comprises:
    (a) applying a chemically amplified photoresist to a substrate, the photoresist having:
        a film-forming polymer having:
            acid-labile groups that are cleaved under action of acid to liberate groups that result in an increase in a solubility of the film-forming polymer in aqueous alkaline developers; and
            anchor groups for linkage of amplification agents;
        a photo acid generator;
        a solvent in which the film-forming polymer is soluble, the solvent having a solvent polarity;
    (b) drying the photoresist to produce a resist film;
    (c) exposing the resist film section-by-section to obtain an exposed resist, an acid being liberated by the photo acid generator in exposed parts of the resist film;
    (d) heating the exposed resist, the acid-labile groups being cleaved in the exposed parts and polar groups being liberated on the film-forming polymer, and, as a result, obtaining a contrasted resist having polar resist sections and non-polar resist sections;

(e) developing the contrasted resist with an alkaline developer, the film-forming polymer being insoluble in the alkaline developer, the polar resist sections being removed from the substrate to obtain a structured resist;

(f) applying an amplification agent to the structured resist in a liquid phase, the amplification agent having at least one reactive group that can react with an anchor group of the film-forming polymer, the liquid phase containing a solvent or a solvent mixture in which the film-forming polymer is insoluble, and leaving the solution of the amplification agent on the structured resist to cause linkage of the amplification agent to the film-forming polymer to take place and obtain an amplified resist, wherein the developing of the contrasted resin and chemical amplification of the contrasted resin are carried out in a common step; and (g) washing the amplified resist with a wash medium containing water as a solvent to remove excess amplification agent.

2. The method according to claim 1, which further comprises providing the wash medium with more than 95% by weight of water.

3. The method according to claim 1, which further comprises selecting the liquid phase of the amplification agent to be an aqueous solution or an aqueous emulsion.

4. The method according to claim 1, which further comprises providing the liquid phase of the amplification agent with between 50% and 99% by weight of water.

5. The method according to claim 1, which further comprises providing a swelling promoter in the solution of the amplification agent.

6. The method according to claim 5, which further comprises selecting the swelling promoter from a group consisting of an alcohol, a carboxylic acid, and a surfactant.

7. The method according to claim 1, which further comprises providing a sterically hindered base or tertiary amine in the solution of the amplification agent.

8. The method according to claim 1, which further comprises selecting the reactive group of the amplification agent as an amino group.

9. The method according to claim 1, which further comprises providing the amplification agent with at least two reactive groups that can react with the anchor group of the film-forming polymer.

10. The method according to claim 2, which further comprises selecting the liquid phase of the amplification agent to be an aqueous solution or an aqueous emulsion.

11. The method according to claim 10, which further comprises providing the liquid phase of the amplification agent with between 50% and 99% by weight of water.

12. The method according to claim 11, which further comprises providing a swelling promoter in the solution of the amplification agent.

13. The method according to claim 12, which further comprises selecting the swelling promoter from a group consisting of an alcohol, a carboxylic acid, and a surfactant.

14. The method according to claim 11, which further comprises providing a sterically hindered base or tertiary amine in the solution of the amplification agent.

15. The method according to claim 13, which further comprises selecting the reactive group of the amplification agent as an amino group.

16. The method according to claim 14, which further comprises selecting the reactive group of the amplification agent as an amino group.

17. The method according to claim 15, which further comprises providing the amplification agent with at least two reactive groups that can react with the anchor group of the film-forming polymer.

18. The method according to claim 16, which further comprises providing the amplification agent with at least two reactive groups that can react with the anchor group of the film-forming polymer.

19. The method according to claim 1, wherein at least one anchor group is a protected anchor group.

* * * * *